(12) United States Patent
Jeong et al.

(10) Patent No.: US 7,995,011 B2
(45) Date of Patent: Aug. 9, 2011

(54) ORGANIC LIGHT EMITTING DISPLAY DEVICE AND MOTHER SUBSTRATE OF THE SAME

(75) Inventors: Jin-tae Jeong, Suwon-si (KR); Won-kyu Kwak, Suwon-si (KR)

(73) Assignee: Samsung Mobile Display Co., Ltd., Suwon-si, Gyeonggi-do (KR)

(*) Notice: Subject to any disclaimer, the term of this patent is extended or adjusted under 35 U.S.C. 154(b) by 982 days.

(21) Appl. No.: 11/882,051

(22) Filed: Jul. 30, 2007

(65) Prior Publication Data
US 2008/0054798 A1 Mar. 6, 2008

(30) Foreign Application Priority Data
Aug. 30, 2006 (KR) ........................ 10-2006-0083148

(51) Int. Cl.
G09G 3/30 (2006.01)
G09G 3/10 (2006.01)
G01R 31/26 (2006.01)

(52) U.S. Cl. .................. 345/76; 324/760.01; 315/169.3

(58) Field of Classification Search ............... 315/169.2, 315/169.3; 345/76, 84, 90, 91, 92, 77, 78, 345/79, 204; 324/760.01, 760.02
See application file for complete search history.

(56) References Cited

U.S. PATENT DOCUMENTS

| | | | |
|---|---|---|---|
| 6,370,019 B1 | 4/2002 | Matthies et al. | |
| 6,476,783 B2 | 11/2002 | Matthies et al. | |
| 6,498,592 B1 | 12/2002 | Matthies | |
| 6,731,368 B2 | 5/2004 | Yu et al. | |
| 6,897,855 B1 | 5/2005 | Matthies et al. | |
| 7,015,509 B2* | 3/2006 | Aruga | 257/72 |
| 7,106,283 B2* | 9/2006 | Satoh | 345/76 |
| 7,145,533 B2 | 12/2006 | Imamura | |
| 7,518,602 B2 | 4/2009 | Nozawa | |
| 2002/0093358 A1 | 7/2002 | Kang | |
| 2004/0100428 A1 | 5/2004 | Satoh | |
| 2005/0012518 A1 | 1/2005 | Lee | |
| 2005/0057273 A1 | 3/2005 | Lin et al. | |
| 2005/0122297 A1 | 6/2005 | Imagawa et al. | |
| 2007/0001711 A1 | 1/2007 | Kwak | |

FOREIGN PATENT DOCUMENTS

| | | |
|---|---|---|
| EP | 1 843 318 A | 10/2007 |
| JP | 2003-043980 A | 2/2003 |
| JP | 2003-107136 A | 4/2003 |
| JP | 2003-218178 | 7/2003 |
| JP | 2003-324156 | 11/2003 |

(Continued)

*Primary Examiner* — Douglas W Owens
*Assistant Examiner* — Minh D A
(74) *Attorney, Agent, or Firm* — Lee & Morse, P.C.

(57) ABSTRACT

An organic light emitting display device may include a pixel portion including a plurality of pixels, which are coupled to scan lines and data lines, a scan driver adapted to provide scan signals to the scan lines, a first transistor group adapted to test the plurality of pixels, the first transistor group being directly connected to first ends of the data lines, a second transistor group adapted to test the plurality of pixels, the second transistor group being connected to second ends of the data lines, a data distributor coupled between the second ends of the data lines and the second transistor group, a first wire group extending in a first direction at an outer area of the light emitting display device, and a second wire group extending in a second direction at the outer area of the light emitting display device.

29 Claims, 5 Drawing Sheets

FOREIGN PATENT DOCUMENTS

| | | |
|---|---|---|
| JP | 2004-515810 A | 5/2004 |
| JP | 2005-091874 A | 4/2005 |
| JP | 2005-331744 | 12/2005 |
| JP | 2006-189809 A | 7/2006 |
| KR | 10-2002-0038877 A | 5/2002 |
| KR | 10-2002-0041212 A | 6/2002 |
| KR | 10-2003-0046801 A | 6/2003 |
| KR | 10-2004-0028363 | 4/2004 |
| KR | 10-2004-0088211 A | 10/2004 |
| KR | 10-2005-0064550 | 6/2005 |
| KR | 10-2006-0057951 | 5/2006 |
| KR | 10-2007-0001583 A | 1/2007 |
| WO | WO 02/47310 | 6/2002 |

\* cited by examiner

| Bias Resistor (ohm) | CLA | | | CLB | | | CLC | | | T_GATE | | | T_DATA | | |
|---|---|---|---|---|---|---|---|---|---|---|---|---|---|---|---|
| | SHEET UNIT TEST Voltage (5V) | A/T Voltage (-7V) | A/T Current[mA] (Spec<20mA) | SHEET UNIT TEST Voltage (5V) | A/T Voltage (-7V) | A/T Current[mA] (Spec<20mA) | SHEET UNIT TEST Voltage (5V) | A/T Voltage (-7V) | A/T Current[mA] (Spec<20mA) | SHEET UNIT TEST Voltage (5V) | A/T Voltage (-7V) | A/T Current[mA] (Spec<20mA) | SHEET UNIT TEST Voltage (5V) | A/T Voltage (Vdata) | A/T Current[mA] (Spec<20mA) |
| 100 | 5.00 | -7.00 | 114.060 | 5.00 | -7.00 | 114.060 | 5.00 | -7.00 | 114.060 | 5.00 | -7.00 | 12.000 | 5.00 | 4.20 | 0.800 |
| 300 | 5.00 | -7.00 | 38.020 | 5.00 | -7.00 | 38.020 | 5.00 | -7.00 | 38.020 | 5.00 | -7.00 | 12.000 | 5.00 | 4.20 | 0.800 |
| 500 | 5.00 | -7.00 | 22.812 | 5.00 | -7.00 | 22.812 | 5.00 | -7.00 | 22.812 | 5.00 | -7.00 | 12.000 | 5.00 | 4.20 | 0.800 |
| 700 | 5.00 | -7.00 | 16.294 | 5.00 | -7.00 | 16.294 | 5.00 | -7.00 | 16.294 | 5.00 | -7.00 | 12.000 | 5.00 | 4.20 | 0.800 |
| 900 | 5.00 | -7.00 | 12.673 | 5.00 | -7.00 | 12.673 | 5.00 | -7.00 | 12.673 | 5.00 | -7.00 | 12.000 | 5.00 | 4.20 | 0.800 |
| 1100 | 5.00 | -7.00 | 10.369 | 5.00 | -7.00 | 10.369 | 5.00 | -7.00 | 10.369 | 5.00 | -7.00 | 12.000 | 5.00 | 4.20 | 0.800 |
| 1300 | 5.00 | -7.00 | 8.774 | 5.00 | -7.00 | 8.774 | 5.00 | -7.00 | 8.774 | 5.00 | -7.00 | 12.000 | 5.00 | 4.20 | 0.800 |
| 1500 | 5.00 | -7.00 | 7.604 | 5.00 | -7.00 | 7.604 | 5.00 | -7.00 | 7.604 | 5.00 | -7.00 | 12.000 | 5.00 | 4.20 | 0.800 |
| 1700 | 5.00 | -7.00 | 6.709 | 5.00 | -7.00 | 6.709 | 5.00 | -7.00 | 6.709 | 5.00 | -7.00 | 12.000 | 5.00 | 4.20 | 0.800 |
| 1900 | 5.00 | -7.00 | 6.003 | 5.00 | -7.00 | 6.003 | 5.00 | -7.00 | 6.003 | 5.00 | -7.00 | 12.000 | 5.00 | 4.20 | 0.800 |

ORGANIC LIGHT EMITTING DISPLAY DEVICE AND MOTHER SUBSTRATE OF THE SAME

CROSS-REFERENCE TO RELATED APPLICATION

Cross-reference is made to concurrently filed U.S. patent application having the same title of "Organic Light Emitting Display Device and Mother Substrate of the Same" corresponding to U.S. patent application Ser. No. 11/882,052.

BACKGROUND OF THE INVENTION

1. Field of the Invention

The present invention relates to a light emitting display device and a mother substrate of the same. More particularly, the invention relates to a light emitting display device, e.g., an organic light emitting display device, and a mother substrate of the same, which may perform a sheet unit test while preventing an erroneous operation of the light emitting display device due to a signal delay with respect to a plurality of organic light emitting display devices formed on the mother substrate, and may separately perform tests on the mother substrate with respect to all structural elements used when the light emitting display device is driven.

2. Description of the Related Art

Generally, after a plurality of light emitting display devices, e.g., organic light emitting display devices are formed on a mother substrate, they are scribed so as to be separated into individual light emitting display devices. Tests for the light emitting display devices may then be separately performed for each light emitting display device that has been scribed.

The tests for the light emitting display devices may be performed using test equipment for testing the individual light emitting display devices. If the circuit wires constituting the light emitting display devices are changed or the sizes of the light emitting display devices are changed, the test equipment or jigs for performing the test should be changed. Further, because the light emitting display devices should be separately tested, the test time and the cost may increase, thereby lowering the efficiency of the testing.

Therefore, it is desirable to perform the tests for the plurality of light emitting display devices on the mother substrate as a sheet unit before scribing the light emitting display devices. Further, when performing the tests on the mother substrate, it is desired to perform the sheet unit tests without a problem due to a signal delay. In addition, it is desirable to have a test that may be performed on the mother substrate with respect to all structural elements that may be used when the organic light emitting display devices are driven.

SUMMARY OF THE INVENTION

The present invention is therefore directed to a light emitting display and a mother substrate thereof, which substantially overcome one or more of the problems due to the limitations and disadvantages of the related art.

It is therefore a feature of an embodiment of the present invention to provide a light emitting display, e.g., an organic light emitting display, and a mother substrate thereof, which allow a sheet unit test to be performed with respect to a plurality of and/or all of the light emitting display devices formed on the mother substrate.

It is therefore a separate feature of an embodiment of the present invention to provide a light emitting display, e.g., an organic light emitting display, and a mother substrate thereof for which a sheet unit test can performed by directly supplying a test signal to a pixel portion.

It is therefore a separate feature of an embodiment of the present invention to provide a light emitting display, e.g., an organic light emitting display, and a mother substrate thereof for which a sheet unit test may be performed without passing a test signal through a data distributor, thereby eliminating a problem due to a drive signal delay of a data distributor when the test is performed on the mother substrate.

It is therefore a separate feature of an embodiment of the present invention to provide a light emitting display, e.g., an organic light emitting display, and a mother substrate thereof, which may be employed to separately perform tests, before scribing, with respect to all or substantially all structural elements that may be used when driving the light emitting displays after scribing.

At least one of the above and other features and advantages of the present invention may be realized by providing an organic light emitting display device, including a pixel portion including a plurality of pixels, which are coupled to scan lines and data lines, a scan driver adapted to provide scan signals to the scan lines, a first transistor group adapted to test the plurality of pixels, the first transistor group being directly connected to first ends of the data lines, a second transistor group adapted to test the plurality of pixels, the second transistor group being connected to second ends of the data lines, a data distributor coupled between the second ends of the data lines and the second transistor group, a first wire group extending in a first direction at an outer area of the light emitting display device, and a second wire group extending in a second direction at the outer area of the light emitting display device.

The data lines may be directly connected to the pixel portion such that the data lines directly connect the first transistor group to the pixel portion. The first transistor group may include a plurality of transistors, each of the plurality of transistors of the first transistor group being connected to one of the data lines, a gate electrode of the transistors being commonly connected to a pad of a pad portion, and each of the transistors maintaining an off state according to an externally supplied bias signal. The plurality of transistors of the first transistor group may include a first color transistor group, a second color transistor group and a third color transistor group that are connected to a first, second and third pad of a pad portion of the light emitting display. The organic light emitting display device may include at least two resistors including one terminal electrically coupled to a predetermined wire included in the first or second wire group and another terminal that is in an electrically open state.

The second transistor group may include a plurality of transistors, which are coupled between a pad included in a pad portion and the data distributor. Gate electrodes of the transistors of the second transistor group may be commonly coupled to a second pad included in the pad portion, and the transistors may simultaneously turn-on based on a second test control signal supplied from the second pad and supply the second test data signal to the data distributor. The plurality of transistors of the second transistor group may include a first color transistor group, a second color transistor group and a third color transistor group that are connected to a third, fourth and fifth pad of a pad portion of the light emitting display.

The pad portion may be further away from the pixel portion than the data distributor. The first transistor group may be arranged on a first side of the pixel portion, and the second transistor group and the data distributor are arranged on a second side of the pixel portion, the first side being opposite to the second side. The plurality of transistors in the second transistor group may maintain an off state based on an externally supplied bias signal. An end of the first wire group and an end of the second wire group may be in an electrically open state.

At least one of the first wire group and the second wire group may be electrically disconnected from the pixel portion. The first wire group and the second wire group may be electrically disconnected from the pixel portion.

At least one of the above and other features and advantages of the present invention may be realized by providing a mother substrate including a plurality of organic light emitting display devices, including a first wire group extending in a first direction at outer areas of the organic light emitting display devices, and a second wire group extending in a second direction at the outer areas of the organic light emitting display devices, wherein each of the organic light emitting display devices may include a pixel portion including a plurality of pixels, which are coupled to scan lines and data lines, a scan driver adapted to provide scan signals to the scan lines, a first test section coupled to first ends of the data lines, a second test section coupled to second ends of the data lines, a data distributor coupled between the second ends of the data lines and the second test section, and at least two resistors between a predetermined wire included in the first or second wire group and the second test section, and between the predetermined wire and the data distributor.

Each of the organic light emitting display devices may further include a pad portion including a plurality of pads for receiving externally supplied power supply voltages and signals. The resistors may be disposed between the pad portion and the predetermined wire included in the first or second wire group. The second test section may include a plurality of transistors having a first terminal thereof coupled to the data distributor, a second terminal thereof coupled to a first pad of the plurality of pads, and a gate terminal commonly coupled to a second pad of the plurality of pads, wherein one of the resistors is arranged between the first pad and a predetermined wire including in the first or second wire group, and another of the resistors is arranged between the second pad and the predetermined wire group.

The resistors may be disposed outside of a scribe line of the organic light emitting display device in which the second test section and the data distributor connected to the resistor are arranged. The data distributor may include first distribution transistors coupled between one of transistors included in the second test section and data lines of a first sub-pixel of the pixel portion, second distribution transistors coupled between one of transistors included in the second test section and data lines of a second sub-pixel of the pixel portion, and third distribution transistors coupled between one of transistors included in the second test section and data lines of a third sub-pixel of the pixel portion.

One of the resistors may be disposed between a third pad to which gate electrodes of the first distribution transistors are coupled in common and a predetermined wire included in the first or second wire group, a second one of the resistors is disposed between a fourth pad to which gate electrodes of the second distribution transistors are coupled in common and the predetermined wire, and a third one of the resistors is disposed between a fifth pad to which gate electrodes of the third distribution transistors are coupled in common and the predetermined wire, respectively.

Each of the first and second test sections may include a plurality of transistors coupled to the data lines, the transistors included in the first test section may be turned on during a first period of time and the transistors included in the second test section may be turned on during a second period of time, wherein the first period of time may be different from the second period of time.

The transistors included in the first test section may be simultaneously turned-on according to a first test control signal supplied from the first or second wire group and supply a first test data signal from the first or second wire group to the data lines, and the transistors included in the second test section maintain an off state according to a bias signal supplied from the first or second wire group through the resistor.

The data distributor may include a plurality of transistors between the transistors included in the second test section and the data lines, and the transistors included in the data distributors maintain an off state according to a bias signal supplied from the first or second wire group through the resistor. The transistors included in the first test section may maintain an off state according to a predetermined control signal supplied from the first or second wire group, and the transistors included in the second test section may be simultaneously turned-on according to a second test control signal supplied from an exterior through a pad portion.

The data distributor may supply a second test data signal from the second test section to at least one of first sub pixels, second sub pixels, and third sub pixels. The first wire group may be connected to respective ones of the organic light emitting display devices, which may be commonly disposed in a same column, and the second wire group may be connected to respective ones of the organic light emitting display devices, which may be commonly disposed in a same row.

The first test section may include a plurality of transistors coupled between one of the wires included in the first or second wire group and one of the data lines. The transistors included in the first test section may be simultaneously turned-on according to a first test control signal supplied from a predetermined wire of the first or second wire group, and may supply a first test data signal to the data line.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0083148, filed on Aug. 30, 2006, in the Korean Intellectual Property Office, and entitled: "Organic Light Emitting Display Device and Mother Substrate of the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

In the following description of exemplary embodiments, organic light emitting display devices may be employed as exemplary light emitting display devices. However, embodiments of the invention are not limited to organic light emitting display devices and one or more aspects of the invention may be applied to other light emitting display devices.

Hereinafter, exemplary embodiments of one or more aspects of the present invention will be described in detail with reference to FIGS. 1 to 6.

Figure 1:
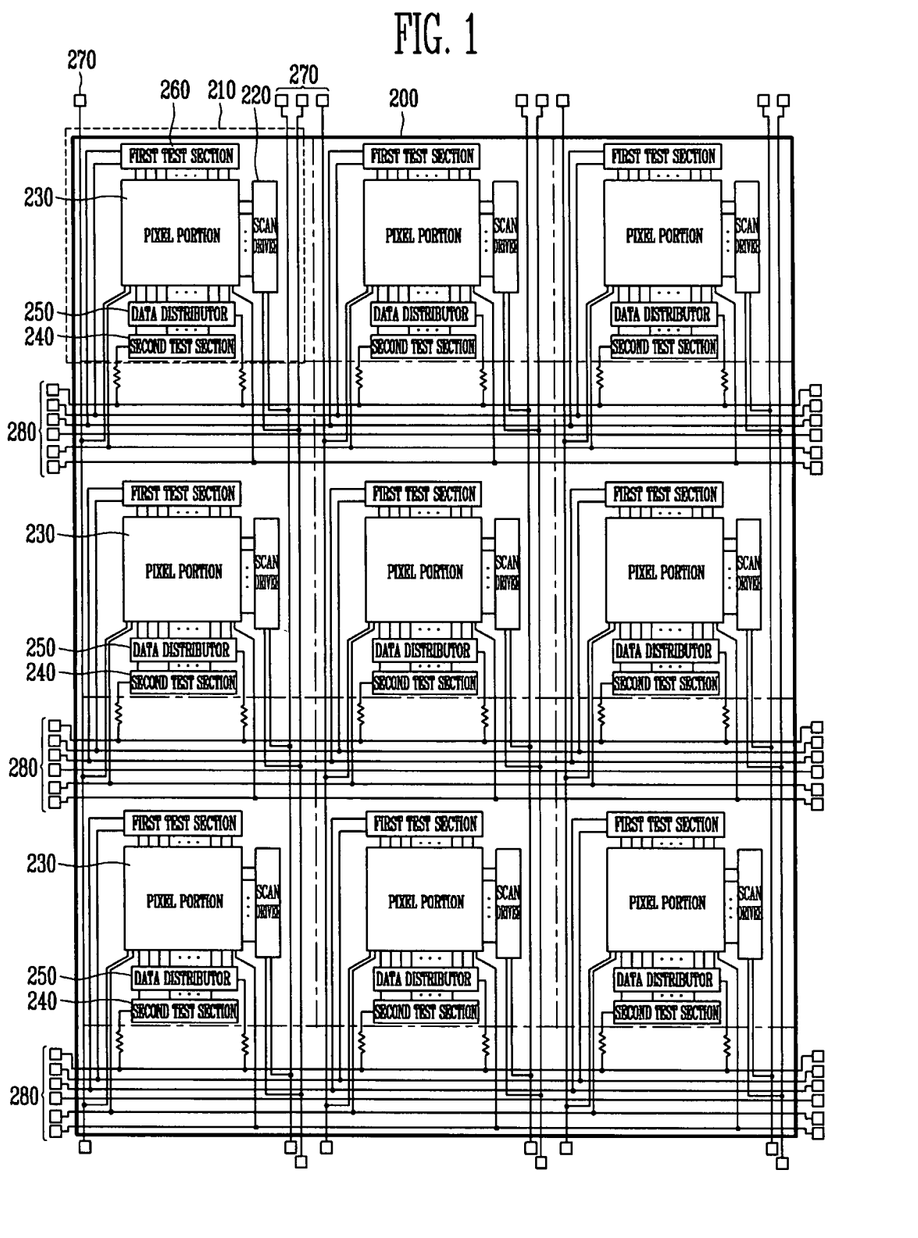
FIG. 1 illustrates a schematic diagram of a mother substrate on which light emitting display devices are formed according to an exemplary embodiment of the present invention.

FIG. 1 illustrates a schematic diagram of a mother substrate 200 on which light emitting display devices, e.g., organic light emitting displays, are formed according to an exemplary embodiment of the present invention.

Referring to FIG. 1, in some embodiments of the invention, the mother substrate 200 may include a plurality of organic light emitting display devices 210 arranged in an array, and a first wire group 270 and a second wire group 280 formed on areas of the mother substrate 200 beyond where the organic light emitting display devices 210 are formed, e.g., at outer areas of the organic light emitting display devices 210.

Each of the organic light emitting display devices 210 may include a scan driver 220, a pixel portion 230, a first test section 260, a second test section 240, and a data distributor 250.

When a test for the organic light emitting display devices 210 formed on the mother substrate 200 is performed, the first test section 260 and the second test section 240 may supply a test signal to the pixel portion 230. In some embodiments of the invention, the first test section 260 and the second test section 240 may not be simultaneously turned-on. In such cases, e.g., the first test section 260 may be in an off-state when the second test section 240 is turned-on, and the second test section 240 may be in an off-state when the first test section 260 is turned-on. More particularly, in some embodiments of the invention, while the first test section 260 is turned-on and may be supplying a test signal to the pixel portion 230, the second test section 240 may maintain an off state, and while the second test section 240 is turned-on and may be supplying the test signal to the pixel portion 230 through the data distributor 250, the first test section 260 may maintain an off state.

The first wire group 270 may be formed to extend along a first direction, e.g., along a vertical direction, and may be commonly connected to the organic light emitting display devices 210 located in a same column on the mother substrate 200. The second wire group 280 may be formed to extend along a second direction, e.g., along a horizontal direction, and may be commonly connected to the organic light emitting display devices 210 located in a same row on the mother substrate 200.

The first and second wire groups 270 and 280 may include a predetermined number of wires, which may supply voltages from, e.g., voltage sources, and signals for a sheet unit test to the plurality of organic light emitting display devices 210.

In the mother substrate 200 according to the exemplary embodiment of the present invention, a sheet unit test may be performed with the organic light emitting display devices 210 formed on the mother substrate, which has not been scribed.

More particularly, the tests may be performed on the organic light emitting display devices 210 connected to the first and second wire groups 270 and 280, which may be coupled to a plurality of organic light emitting display devices 210, by supplying voltages from, e.g., voltage sources, and signals for the sheet unit tests to the first and second wire groups 270 and 280.

Therefore, the testing time and/or the testing costs may be reduced, and the efficiency of the test may be increased. Further, even if the circuit wires of the organic light emitting display devices 210 are changed and/or the size of the organic light emitting display devices 210 is changed, the test may be performed without changing test equipment or jigs in cases where the circuit wires of the first and second wire groups 270 and 280, and the sizes of the mother substrate 200 are not changed.

Further, when wires receiving source voltages, e.g., voltages from voltage sources, are formed to extend in different directions, it is possible to perform a test in a predetermined one of the organic light emitting display devices 210 formed on the mother substrate 200. For example, a wire receiving a voltage of a first voltage source ELVDD may be included in the first wire group 270, and a wire receiving a voltage of a second voltage source ELVSS may be included in the second wire group 280. In some embodiments of the invention, voltage sources and signals may be selectively supplied to one, some or all of the first and second wire groups 270 and 280, and depending on the ones of the first and second wire groups 270, 280 to which the voltage sources and signals are supplied during a period of time, one, some or all of the organic light emitting display devices 210 may be tested during that time. More particularly, e.g., in some embodiments, e.g., so long as voltage sources and signals are simultaneously supplied to one of the first wire groups 270 and one of the second wire groups 280, a test may be performed on at least one predetermined one of the organic light emitting display devices 210 formed on the mother substrate 200.

When employing a mother substrate 200 according to one or more aspects of the present invention, a test may be simultaneously performed on one, some or all of the organic light emitting display devices 210 on the mother substrate 200, using the first and second wire groups 270 and 280.

Referring to FIG. 1, in some embodiments of the invention, at least one resistor may be formed between one of the wires included in the first or second wire groups 270 and 280 and the second test section 240 and/or at least one resistor may be formed between the wire including the resistor and the data distributor 250. In other words, in some embodiments of the present invention, at least two resistors may be included along a path of at least one of the wires included in the first or second wire groups 270, 280, e.g., at least one resistor connected to the second test section 240 and at least one resistor connected to the data distributor 250.

After the first test section 260 is employed to perform a sheet unit test for the plurality of organic light emitting display devices 210 on the mother substrate 200, the resistor(s) may be employed to perform a test for the individual organic light emitting display devices 210 formed on the mother substrate, which has not yet been scribed, using the second test section 240 and the data distributor 250.

In some embodiments of the invention, after the testing, e.g., the sheet unit test is completed, the organic light emitting display devices 210 formed on the mother substrate 200 may be scribed. A scribing line 290 (shown in FIG. 2) may be located so as to electrically separate the first and second wire groups 270 and 280 from the scan driver 220, the pixel portion 230, the data distributor 250, and the test section 260, which may be included as part of the organic light emitting display device 210, after a scribing process. Thus, in some embodiments of the invention, electrical contact points, i.e., points where the first and/or second wire groups 270, 280 electrically connect to portions of the organic light emitting display devices 210, may be located outside of the scribe line 290, i.e., on a side of the scribe line 290 that is opposite to a side of the scribe line 290 where the organic light emitting display device 210 is arranged. For example, in some embodiments of the invention, the scribe line(s) 290 may extend such that when the organic light emitting display devices 210 are scribed, portions of each of the first and second wire groups 270, 280 may be separated from the scan driver 220, the pixel portion 230, the data distributor 250, the first test section 260, and the second test section 270 of the organic light emitting display device 210. Thus, in some embodiments of the invention, the first and second wire groups 270, 280 may be electrically disconnected from the organic light emitting display device 210 after the organic light emitting display device 210 is scribed.

Further, as discussed above, respective resistors may be disposed between at least one of the wires included in the first and second wire groups 270 and 280 and each of the second test section 240 and the data distributor 250. In some embodiments of the invention, the respective resistors may be located at an outside of the scribbling line 290 of the organic light emitting display device 210. Thus, when the respective organic light emitting display devices 210 are scribed, one terminal of the respective resistors may be electrically disconnected, i.e., in an electrically open state, whereas another terminal of the respective resistors may remain electrically connected to the respective at least one wire included in the first or second wire groups 270, 280.

Accordingly, in embodiments of the invention, after the scribing has been completed, the first and second wire groups 270 and 280 may be electrically disconnected. Thus, noise, e.g., static electricity, which may be introduced to the first and second wire groups 270 and 280 from the outside, may not be supplied to the scan driver 220, the pixel portion 230, the first test section 260, the second test section 240, and the data distributor 250.

Figure 2:
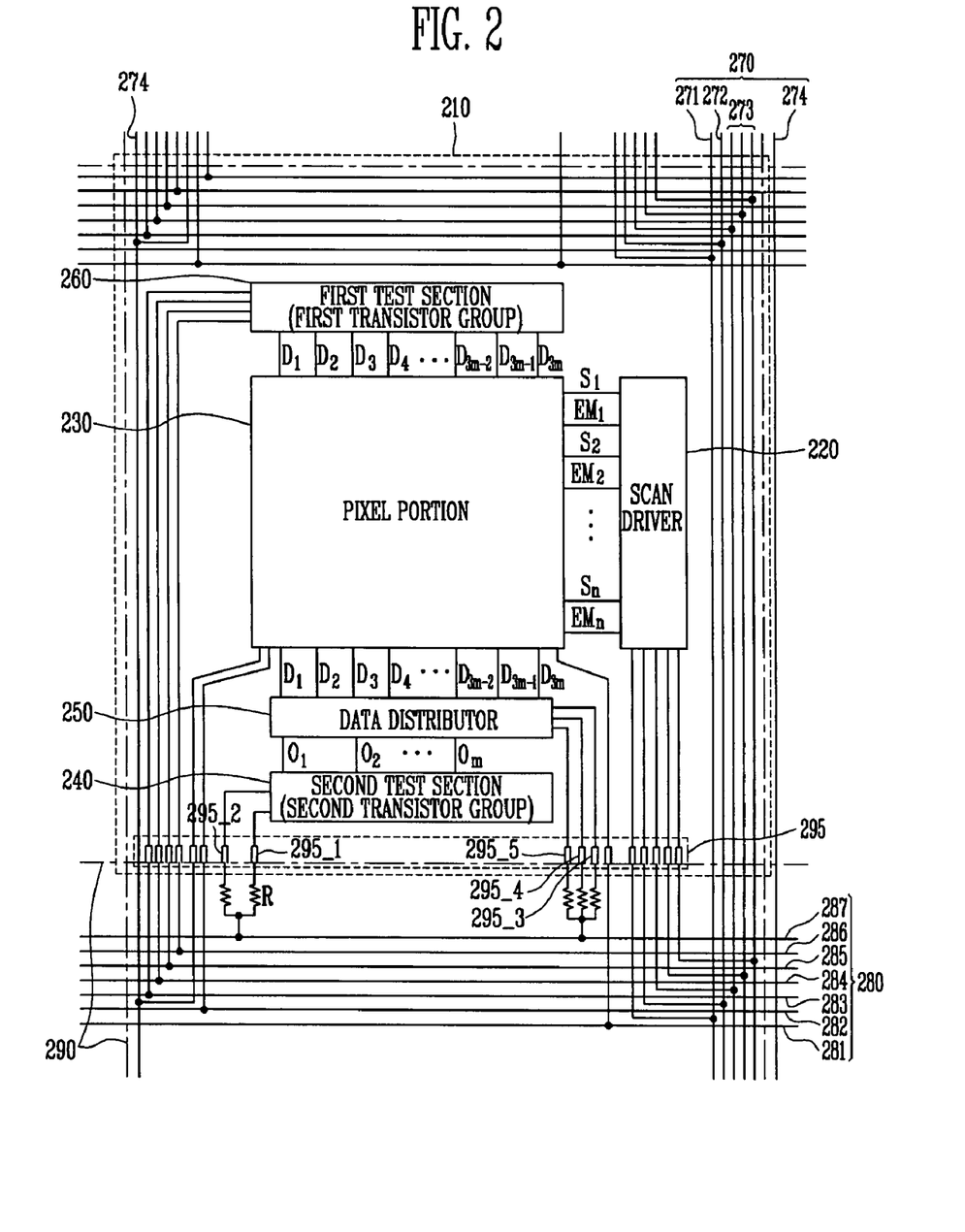
FIGS. 2 and 3 illustrate more detailed schematic diagrams of one of the light emitting display devices and wire groups shown in FIG. 1.
Figure 3:
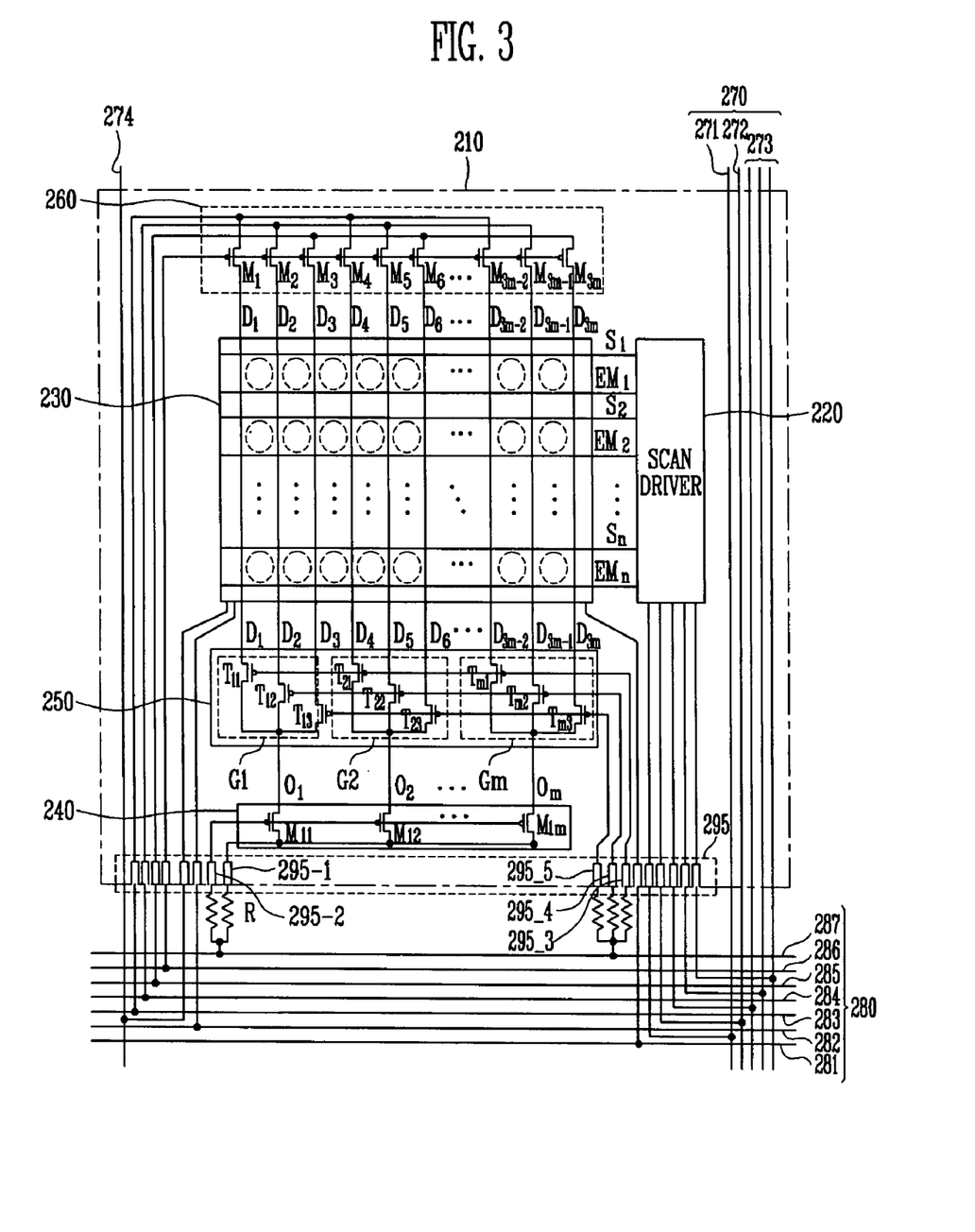

FIGS. 2 and 3 illustrate a more detailed schematic diagram of one of the light emitting displays and wire groups shown in FIG. 1.

As discussed above and as shown in FIGS. 2 and 3, the organic light emitting display device 210 may include the scan driver 220, the pixel portion 230, the first test section 260, the second test section 240, and the data distributor 250. Further, as shown in FIGS. 2 and 3, the organic light emitting display device 210 may include a pad portion 295. The first and second wire groups 270 and 280 may be located on the outer side of the organic light emitting display device 210.

Referring to FIG. 2, the first wire group 270 may include a first wire 271 to which a voltage of a third voltage source VDD may be supplied, a second wire 272 to which a voltage of a fourth voltage source VSS may be supplied, third wires 273 to which scan control signals may be supplied, and a fourth wire 274 to which the first source voltage ELVDD may be supplied.

During the sheet unit test, the first wire 271 may supply the third source voltage VDD to the scan driver 220 of each of the organic light emitting display devices 210, which may be connected to the first wire 271.

During the sheet unit test, the second wire 272 may supply the voltage of the fourth voltage source VSS to the scan driver 220 of each of the organic light emitting display devices 210, which may be connected to the second wire 272.

During the sheet unit test, the third wires 273 may receive the scan control signals and may supply the scan control signals to the scan driver 220 of each of the organic light emitting display devices 210, which may be connected to the third wires 273. The scan control signals may include a clock signal, an output enable signal, a start pulse, etc. of the scan driver 220. In some embodiments of the invention, a number of the scan control signals supplied to the scan driver 220 can be variously set based on the circuit constitution of the scan driver 220. Therefore, the number of the third wires 273 may be determined by the circuit constitution of the scan driver 220. In the following description, for the sake of convenience, the third wires 273 will be assumed to include three wires. Embodiments of the invention are not limited to such characteristics. That is, e.g., the third wires may include less than or more than three wires.

During the sheet unit test, the fourth wire 274 may supply the first source voltage ELVDD to the pixel portion 230 of each of the organic light emitting display devices 210, which may be connected to the fourth wire 274.

The second wire group 280 may include a plurality of wires. For example, the second wire group 280 may include seven wires, e.g., an eleventh wire 281 to which the voltage of the second voltage source ELVSS may be supplied, a twelfth wire 282 to which an initializing voltage Vinit may be supplied, a thirteenth wire 283 to which a first red test data signal may be supplied, a fourteenth wire 283 to which a first green test data signal may be supplied, a fifteenth wire 285 to which a first blue test data signal may be supplied, a sixteenth wire 286 to which a first test control signal may be supplied, and a seventeenth wire 287 to which a bias voltage may be supplied.

During the sheet unit test, the eleventh wire 281 may supply the voltage of the second voltage source ELVSS to the pixel portion 230 of each of the organic light emitting display devices 210, which may be connected to the eleventh wire 281.

During the sheet unit test, the twelfth wire 282 may supply the initializing voltage Vinit to the pixel portion 230 of each of the organic light emitting display devices 210, which may be connected to the twelfth wire 282.

During the sheet unit test, the thirteenth wire 283 may supply the first red test data signal to the first test section 260 of each of the organic light emitting display devices 210, which may be connected to the thirteenth wire 283.

During the sheet unit test, the fourteenth wire 284 may supply the first green test data signal to the first test section 260 of each of the organic light emitting display devices 210, which may be connected to the fourteenth wire 284.

During the sheet unit test, the fifteenth wire 285 may supply the first blue test data signal to the first test section 260 of each of the organic light emitting display devices 210, which may be connected to the fifteenth wire 285.

During the sheet unit test, the sixteenth wire 286 may supply the first test control signal to the first test section 260 of each of the organic light emitting display devices 210, which may be connected to the sixteenth wire 286.

During the sheet unit test, the seventeenth wire 287 may supply the bias voltage to the data distributor 250 of each of the organic light emitting display devices 210, which may be connected to the seventeenth wire 287.

Although in the exemplary embodiment described herein with reference to FIGS. 2 and 3, the first wire group 270 is shown to include the first to fourth wires 271 to 274 and the second wire group 280 is shown to include the eleventh to seventeenth wires 281 to 287, embodiments of the invention are not limited to such characteristics. That is, e.g., the first wire group 270 may include less than or more than four wires and the second wire group 280 may include less than or more than seven wires. Further, e.g., the first wire 271, which may supply the voltage of the first voltage source ELVDD may be included in both of the first and second wire groups 270 and 280 or in one of the first and second wire groups 270 and 280.

The scan driver 220 may receive the voltage of the third voltage source VDD, the voltage of the fourth voltage source VSS, and the scan control signals from the first wire 271, the second wire 272, and the third wires 273, which may be included in the first wire group 270, respectively. The scan driver 220 may generate scan signals and emission control signals based on the voltages of the third and fourth voltage sources VDD and VSS and the scan control signals. The scan signals and the emission control signals, which may be generated in the scan driver 220, may be supplied to the pixel portion 230 through the scan lines $S_1$ to $S_n$ and the emission control lines $EM_1$ to $EM_n$.

In the exemplary embodiment of the present invention described above, the scan driver 220 may generate both the scan signals and the emission control signals. However, embodiments of the present invention are not limited thereto. For example, in some embodiments of the invention, the scan driver 220 may generate only the scan signals and a separate emission control driver may generate only the emission control signals.

The pixel portion 230 may include a plurality of pixels connected to the scan lines $S_1$ to $S_n$ and the data lines $D_1$ to $D_{3m}$. Each of the pixels may include an organic light emitting diode OLED and a plurality of sub-pixels, e.g., a red sub-pixel (first sub-pixel), a green sub-pixel (second sub-pixel), and a blue sub-pixel (third sub-pixel).

During the sheet unit test on the mother substrate 200, the pixel portion 230 may receive the voltage of the first voltage source ELVDD, the voltage of the second voltage source ELVSS, and the initializing voltage Vinit from the fourth wire 274 included in the first wire group 270, the eleventh and twelfth wires 281 and 282 included in the second wire group 280, respectively. In addition, the pixel portion 230 may receive at least one of the first red, green, and blue test data signals from the first test section 260 during the sheet unit test. After receiving the voltage of the first voltage source ELVDD, the initializing voltage Vinit, the voltage of the second voltage source ELVSS, and the test data signals, the pixel portion 230 may display an image corresponding to those received voltages and/or signals. After the organic light emitting display devices 210 are scribed, the pixel portion 230 may receive data signals from the data distributor 250, and may display an image corresponding to the data signals received from the data distributor 250.

The pixel portion 230 may display an image corresponding to second test data signals supplied from the second test section 240 through the data distributor 250 when, e.g., separate tests with respect to the organic light emitting display devices 210 are performed on the mother substrate 200 using the second test section 240 and the data distributor 250.

After the organic light emitting displays 210 are scribed, the pixel portion 230 may display an image corresponding to data signals supplied from a data driver (not shown) through the data distributor 250.

The first test section 260 may be arranged on an upper side of the pixel portion 230, and may be arranged on a side of the pixel portion 230 that is opposite to a side of the pixel portion 230 where the data driver 240 and the data distributor 250 may be arranged. The first test section 260 may be connected to first end portions of the data lines $D_1$ to $D_{3m}$.

As shown in FIG. 3, the first test section 260 may include a plurality of transistors $M_1$ to $M_{3m}$, which may be connected between one of the thirteenth to fifteenth wires 283 to 285 and one of the data lines $D_1$ to $D_{3m}$. For example, transistors $M_1$, $M_4$, . . . , $M_{3m-2}$ may be connected to the thirteenth wire 283 and may be respectively connected to data lines $D_1$, $D_4$, . . . , $D_{3m-2}$ of the red sub-pixels. Transistors $M_2$, $M_5$, . . . , $M_{3m-1}$ may be connected to the fourteenth wire 284 and may be respectively connected to data lines $D_2$, $D_5$, . . . , $D_{3m-1}$ of the green sub-pixels. Transistors $M_3$, $M_6$, . . . , $M_{3m}$ may be connected to the fifteenth wire 285 and may be respectively connected to data lines $D_3$, $D_6$, . . . , $D_{3m}$ of the blue sub-pixels.

Gate electrodes of the transistors $M_1$ to $M_{3m}$, which may be included in the first test section 260, may be commonly connected to the sixteenth wire 286.

While a sheet unit test is performed with the plurality of organic light emitting display devices 210 on the mother substrate 200, the first test section 260 may receive the first red test data signal, the first green test data signal, the first blue test data signal, and a first test control signal from the thirteenth to sixteenth wires 283 to 286, which may be included in the second wire group 280. The first test data signal (the first red test data signal, the first green test data signal, and the first blue test data signal may be commonly referred to as 'first test data signal') may be a signal for determining whether the organic light emitting display device 210 is inferior, i.e., defective, or not, may be set to have various characteristics. For example, the first test data signal may be set as a lighting test data signal.

When the first red test data signal, the first green test data signal, and/or the first blue test data signal, and the first test control signal are supplied, transistors included in the first test section 260 may be simultaneously turned-on according to the first test control signal to supply the first red test data signal, the first green test data signal, and/or the first blue test data signal to the data lines $D_1$ to $D_{3m}$.

The following is a detailed description of an exemplary testing procedure using the first test section 260. First, the first test control signal from the sixteenth wire 286 may be supplied to the transistors $M_1$ to $M_{3m}$ included in the first test section 260, and more particularly, to the gates of the transistors $M_1$ to $M_{3m}$. Thus, the transistors $M_1$ to $M_{3m}$ may be simultaneously or substantially simultaneously turned-on. Accordingly, the first test data signals from the thirteenth to fifteenth wires 283 to 285 may be supplied to respective data lines $D_1$ to $D_{m3}$. The voltage of the third voltage source VDD from the first wire 271, the voltage of the fourth voltage source VSS from the second wire 272, and the scan control signals from the third wires 273 may be supplied to the scan driver 220. When the scan driver 220 receives the voltage of the third voltage source VDD, the voltage of the fourth voltage source VSS, and the scan control signals, it may sequentially generate and provide scan signals and emission control signals to the pixel portion 230. Accordingly, the pixels may emit light to display an image, thereby undergoing a lighting test.

In some embodiments of the invention, the first test section 260 may maintain an off state when a sheet unit test using the first and second wire groups 270 and 280 is not being performed. For example, while a separate test using the second test section 240 and the data distributor 250 is being performed for the respective organic light emitting display devices 210, the transistors $M_1$ to $M_{3m}$ included in the first test section 260 may maintain an off state corresponding to a predetermined control signal supplied from the thirteenth to sixteenth wires 283 to 286. That is, in some embodiments of the invention, the transistors $M_1$ to $M_{3m}$ included in the first test section 260 may maintain an off state while the second test section 240 is turned-on.

Furthermore, after the organic light emitting display devices 210 are scribed from the mother substrate 200, the first test section 260 may maintain an off state corresponding to a bias signal supplied from the pad portion 295. More particularly, after scribing, the first test section 260 may remain attached to the pixel portion 230 of the respective organic light emitting display device 210. However, the transistors of the first test section 260 may not to be used to drive the organic light emitting display device 210.

The second test section 240 may be arranged on a lower side of the pixel portion 230 and may be arranged on a side of the pixel portion 230 that is opposite to the side of the pixel portion 230 where the first test section 260 is arranged. The second test section 240 may be connected to second end portions of the data lines $D_1$ to $D_{3m}$ through the data distributor 250.

As shown in FIG. 3, the second test section 240 may include transistors $M_{11}$ to $M_{1m}$, which may be connected between a first pad 295_1 included in the pad portion 295 and the data distributor 250. Gate electrodes of the transistors $M_{11}$ to $M_{1m}$ may be commonly connected to the second pad 295_2 of the pad portion 295.

While a separate test is performed on the organic light emitting display devices 210 on the mother substrate 200, the second test section 240 may receive a second test data signal and a second test control signal from an external source through the first and second pads 295_ and 295_2. The second test data signal may be a signal for determining whether the organic light emitting display device 210 is or is not inferior, i.e., defective, and may be set according to various characteristics. For example, the second test data signal may be set as a lighting test data signal.

When the second test control signal and the second test data signals are supplied, the transistors $M_{11}$ to $M_{1m}$ may be simultaneously and/or substantially simultaneously turned-on corresponding to the second test control signal, and may provide second test data signals to the data distributor 250.

While a separate test is being performed on the organic light emitting display devices 210 formed on the mother substrate 200, the data distributor 250 may supply the second test data signals from respective output lines $O_1$ to $O_m$ of the second test section 240 to three respective ones of the data lines $D_1$ to $D_m$ associated with each of the pixels, i.e., the respective data lines associated with the red, green, and blue sub-pixels of each pixel.

In embodiments of the invention, the data distributor 250 may include a plurality of group transistors G1 to Gm, which may be connected between the second end portions of the data lines $D_1$ to $D_m$ and the second test section 240.

Each of the group transistors G1 to Gm may include first distribution transistors $T_{11}, T_{21}, \ldots, T_{m1}$, second distribution transistors $T_{12}, T_{22}, \ldots, T_{m2}$ and third distribution transistors $T_{13}, T_{23}, \ldots, T_{m3}$. The first distribution transistors $T_{11}, T_{21}, \ldots, T_{m1}$ may be coupled between one of the transistors $M_{11}$ to $M_{1m}$ included in the second test section 240 and the data lines $D_1, D_4, \ldots, D_{3m-2}$ of the red sub-pixels. The second distribution transistors $T_{12}, T_{22}, \ldots, T_{m2}$ may be coupled between one of the transistors $M_{11}$ to $M_{1m}$ included in the second test section 240 and the data lines $D_2, D_5, \ldots, D_{3m-1}$ of the green sub-pixels. The third distribution transistors $T_{13}, T_{23}, \ldots, T_{m3}$ may be coupled between one of the transistors $M_{11}$ to $M_{1m}$ included in the second test section 240 and the data lines $D_3, D_6, \ldots, D_{3m}$ of the blue sub-pixels.

Gate electrodes of the first distribution transistors $T_{11}, T_{21}, \ldots, T_{m1}$ may be commonly connected to a third pad 295_3 of the pad portion 295. Gate electrodes of the second distribution transistors $T_{12}, T_{22}, \ldots, T_{m2}$ may be commonly connected to a fourth pad 295_4 of the pad portion 295. Gate electrodes of the third distribution transistors $T_{13}, T_{23}, \ldots, T_{m3}$ may be commonly connected to a fifth pad 295_5 of the pad portion 295.

While a separate test may be performed with the organic light emitting display devices 210 formed on the mother substrate 200, the distribution transistors $T_{11}$ to $T_{m3}$ may receive a red clock signal, a green clock signal, and a blue clock signal from the third, fourth, and fifth pads 295_3, 295_4, and 295_5, and may provide a second test data signal from the output lines $O_1$ to $O_m$ of the second test section 240 based on the received red, green and/or blue clock signals. The distribution transistors $T_{11}$, to $T_{m3}$ may control the red clock signal, the green clock signal, and the blue clock signal to display a color image. For example, the distribution transistors $T_{11}$ to $T_{m3}$ may control the red clock signal, the green clock signal, and the blue clock signal at different times to display red, green, and blue images. Further, the distribution transistors $T_{11}$ to $T_{m3}$ may simultaneously provide the red clock signal, the green clock signal, and the blue clock signal to display a white image.

In some embodiments of the invention, the data distributor 250 may not be used in a sheet unit test using the first test section 260. In some embodiments of the invention, when only the separate test is being performed on the organic light emitting display devices 210 formed on the mother substrate 200, the data distributor 250 may provide second test data signals from the second test section 240 to the pixel portion 230 corresponding to control signal from the pad portion 295.

The following is a detailed description of an exemplary separate test that may be respectively performed on the organic light emitting display devices 210 using the second test section 240 and the data distributor 250. First, an array test equipment may supply the second test data signals, the second test control signal, the red clock signal, the green clock signal, and/or the blue clock signal to first, second, third, fourth, and/or fifth pads 295_1, 295_2, 295_3, 295_4, 295_5.

Accordingly, the transistors $M_{11}$ to $M_{1m}$ included in the second test section 240 may be turned-on according to the second test control signal and may output the second test data signals from the first pad 295_1 to the output lines $O_1$ to $O_m$.

The distribution transistors $T_{11}$ to $T_{m3}$ having received the red, green, and/or blue clock signals, may provide second test signals from the output lines $O_1$ to $O_m$ of the second test section 240 to data lines D of red, green, and/or blue sub-pixels according to the received red, green and/or blue clock signals.

Moreover, the scan driver 220 may receive the voltage of the third voltage source VDD, the voltage of the fourth voltage source VSS and/or the scan control signals via the pad portion 295 from, e.g., an external source(s). More particularly, e.g., the scan driver 220 may receive the voltage of the third voltage source VDD from the first wire 271, the voltage of the fourth voltage source VSS from the second wire 272, and scan control signals from the third wires 273. When the scan driver 220 receives the voltage of the third source voltage VDD, the voltage of the fourth source voltage VSS, and the scan control signals, the scan driver 220 may sequentially generate and provide scan signals and emission control signals to the pixel portion 230.

When pixels receive the scan signal, the emission control signal, and the second test data signal, they may emit light to display an image, thereby undergoing a test being performed. In some embodiments of the invention, e.g., when a lighting test data signal is supplied as the second test data signal, an array test and/or the lighting test may be performed.

At this time, the voltage of the first voltage source ELVDD, the voltage of the second voltage source ELVSS, and/or the initializing voltage Vinit may be supplied to the pixel portion 230. More particularly, the voltage of the first voltage source ELVDD, the voltage of the second voltage source ELVSS and the initializing voltage Vinit may be received via the pad portion 295 from, e.g., an external source or through the fourth wire 274, the eleventh wire 281, and the twelfth wire 282.

In embodiments of the invention, while a sheet unit test is performed using the first test section 260 and the first and second wire groups 270 and 280, the second test section 240 and the data distributor 250 may maintain an off state. More particularly, because transistors $M_{11}$ to $M_{1m}$ included in the second test section 240 and distribution transistors $T_{11}$ to $T_{m3}$ included in the data distributor 250 may be coupled to the seventeenth wire 287 through the pad portion 295, they maintain an off state based on the bias signal Vbias supplied from the seventeenth wire 287 through a resistor R. Thus, by maintaining the transistors $M_{11}$ to $M_{1m}$ and the distribution transistors $T_{11}$ to $T_{m3}$ in an off state based on the bias signal Vbias, the first test data signal supplied to the data lines D1 to D3m may not be transferred to the data distributor 250.

After the organic light emitting display devices 210 are scribed from the mother substrate 200, the transistors $M_{11}$ to $M_{1m}$ may maintain an off state according to the externally supplied bias signal Vbias, which may be supplied through the pad portion 295. The second test section 240 may not be used to drive the organic light emitting display device 210 but remain. Further, the data distributor 250 may provide data signals from a data driver (not shown) corresponding to red, green, and blue clock signals supplied from the pad portion 295.

The pad portion 295 may include a plurality of pads for receiving signals and/or voltages, e.g., power source voltages, external signals. The pad portion 295 may be positioned at an edge area adjacent to a scribing line of the organic light emitting display device 210. More particularly, e.g., the pad portion 295 may be positioned so as to remain with the respective organic light emitting device 210 after scribing. However, embodiments of the present invention are not limited thereto.

As described above, in some embodiments of the invention, a sheet unit test may be performed on a plurality of organic light emitting display devices 210 formed on the mother substrate 200 using the first and second wire groups 270 and 280. In such cases, the present invention may supply a test data signal to data lines $D_1$ to $D_{3m}$ using the first test section 260 while the second test section 240 and the data distributor 250 may be in an off state, thereby performing a sheet unit test without problems due to a signal delay.

More particularly, when voltages of power supplies and signals are supplied to a plurality of organic light emitting display devices 210 through the first and second wire groups 270 and 280 in order to perform the sheet unit test, a signal delay and the like can occur. Because the signals supplied through the first and second wire groups 270 and 280 may be externally provided, organic light emitting display devices 210 positioned at a center of the mother substrate 200 may receive a delayed signal and can be erroneously operated.

In particular, when a delay occurs in the red clock signal, the green clock signal, and/or the blue clock signal inputted to the data distributor 250, problems may occur in driving the organic light emitting display device 210. For example, when the red clock signal, the green clock signal, and/or the blue clock signal are delayed and are not supplied within the desired time, a pixel circuit cannot secure a sufficient time to charge a data voltage and thus, an exact image may not be displayed. Moreover, it is difficult to synchronize the test control signal and test data signals with the red clock signal, the green clock signal, and the blue clock signal.

Accordingly, in some embodiments of the present invention, the data distributor 250 may be set to an off state during a sheet unit test and the first test section 260 may be separately provided, so that the test data signals may be directly supplied to the pixel portion 230 from the first and/or second wire groups 270 and 280 through the first test section 260, without passing through the data distributor 250. In some embodiments of the invention, gate electrodes of the transistors $M_1$ to $M_{3m}$ included in the first test section 260 may be commonly connected to the sixteenth wire 286 and may be simultaneously turned-on based on the first test control signal. In this state, because the first red test data signal, the first green test data signal, and/or the first blue test data signal may be supplied to the pixel portion 230, embodiments of the invention may overcome the problems resulting from the pixel circuit not having a sufficient time to charge the data voltage. Moreover, in embodiments of the invention, because the test may be performed without passing through the data distributor 250, it is unnecessary to synchronize the test control signal and test data signals with the red clock signal, the green clock signal, and the blue clock signal and thus, embodiments of the invention may overcome the problem with respect to signal synchronization.

As explained above, while the sheet unit test may be performed using the first test section 260, the data distributor 250 may be set in an off state. In some embodiments of the invention, gate electrodes of the distribution transistors $T_{11}$ to $T_{m3}$ included in the data distributor 250 may be commonly connected to the seventeenth wire 287 included in the second wire group 280 through the pad portion 295. While the sheet unit test may be performed by the first test section 260, the distribution transistors $T_{11}$ to $T_{m3}$ may receive the bias signal Vbias from the seventeenth wire 287 and may maintain an off state. In some embodiments of the present invention, because the distribution transistors $T_{11}$ to $T_{m3}$ may be P-type, the bias signal Vbias can be set to a high level such that a gate high voltage signal $V_{GH}$ may be supplied to the distribution transistors $T_{11}$ to $T_{m3}$. However, the present invention is not limited thereto. That is, e.g., the bias signals Vbias can be set according to characteristics of the distribution transistors $T_{11}$ to $T_{m3}$.

Moreover, while the sheet unit test may be performed, the second test section 240, which may be connected between the data distributor 250 and the pad portion 295, may also maintain an off state. Accordingly, gate electrodes of the transistors $M_{11}$ to $M_{1m}$ included in the second test section 240 may be commonly connected to the seventeenth wire 287. While the sheet unit test is performed, the transistors $M_{11}$ to $M_{1m}$ may receive the bias signal Vbias from the seventeenth wire 287 and may maintain an off state.

In some embodiments of the invention, as is evident from the above explanation, when the sheet unit test is performed using the first test section 260, a test for a plurality of the organic light emitting display devices 210 may be carried out to increase the efficiency of the test. However, in this case, it may not be possible to determine whether all structural elements of the organic light emitting display devices 210 used in a real drive are inferior or not.

However, after the organic light emitting display devices 210 are scribed from the mother substrate 200, the data distributor 250 may perform a function of supplying data signals from the data driver to the data lines $D_1$ to $D_{3m}$. Thus, after the organic light emitting display devices 210 are scribed and are being driven, the data distributor 250 may be used. Accordingly, in some cases employing one or more aspects of the invention, an array test for the data distributor 250 may always or substantially always be performed.

Such an array test for the data distributor 250 may be performed using, e.g., the second test section 240. Thus, some embodiments of the invention may include the second test section 240 for separately testing the respective organic light emitting display devices 210 using the data distributor 250.

External equipment, e.g., an array test equipment, may supply voltages of power supplies and signals through the pad portion 295 to perform a test for the respective organic light emitting display devices 210 using the second test section 240 and the data distributor 250. An exemplary test for the respective organic light emitting display devices 210 using the second test section 240 and the data distributor 250 has been described above and thus, a repetitive description thereof is omitted.

In some cases, while the sheet unit test is performed using the first test section 260, the second test section 240 and the data distributor 250 may be commonly connected to the seventeenth wire 287 and may maintain an off state. Where the second test section 240 and the data distributor 250 are directly connected to the seventeenth wire 287, i.e., without a resistor and the like therebetween, the second test section 240 and the data distributor 250 may be erroneously operated during the separate test of the organic light emitting display devices 210 using array test equipment and the like and thus, as described below, the separate test may not progress satisfactorily.

In cases where the first to fifth pads 295_1 to 295_5 connected to the second test section 240 and the data distributor 250 are directly coupled to the seventeenth wire 287, when the array test equipment supplies the second test control signal, the second test data signals, the red clock signal, the green clock signal, and/or the blue clock signal, the signals can flow to an undesirable path. Resistance may be present at a wire itself, of course. However, when the resistance is less than or equal to a predetermined value, the signals may flow to an abnormal path. For example, the red clock signal supplied to the third pad 295_3 may not be supplied to the first distribution transistors $T_{11}$ to $T_{m1}$ satisfactorily, but may flow to the second and/or distribution transistors $T_{12}$ to $T_{m2}$ and/or $T_{13}$ to $T_{m3}$ through the fourth pad 295_4 and/or the fifth pad 295_5. Namely, when a separate test is performed with the organic light emitting display devices 210 using the second test section 240 and the data distributor 250, an electric current may flow to an abnormal path, thereby causing the test not to progress satisfactorily.

In order to prevent and/or reduce such defects in testing, at least one resistor R may be formed between the first to fifth pads 295_1 to 295_5 and the seventeenth wire 287. A resistance of the resistor R may be set as a value sufficient to stably maintain the second test section 240 and the data distributor 250 in an off state by the bias signal Vbias supplied from the seventeenth wire 287, and to prevent an electric current from flowing to an abnormal path when a test is performed using the second test section 240 and the data distributor 250.

Various resistances of the resistor R can be set according to a specification of the array test equipment. More particularly, the resistance may be set equal to or greater than a value obtained by dividing a level difference between a highest voltage Vh and a lowest voltage Vl by a specification current Is. In embodiments of the invention, the resistance may be set as a value equal to or greater than (Vh−Vl)/Is. Here, the specification current Is may correspond to a maximum current that the test equipment can stably operate. In this case, so as to stably perform the test, the specification current Is of the red clock signal, the green clock signal, and the blue clock signal may be less than or equal to about 70% of that of the test equipment.

Figure 4:
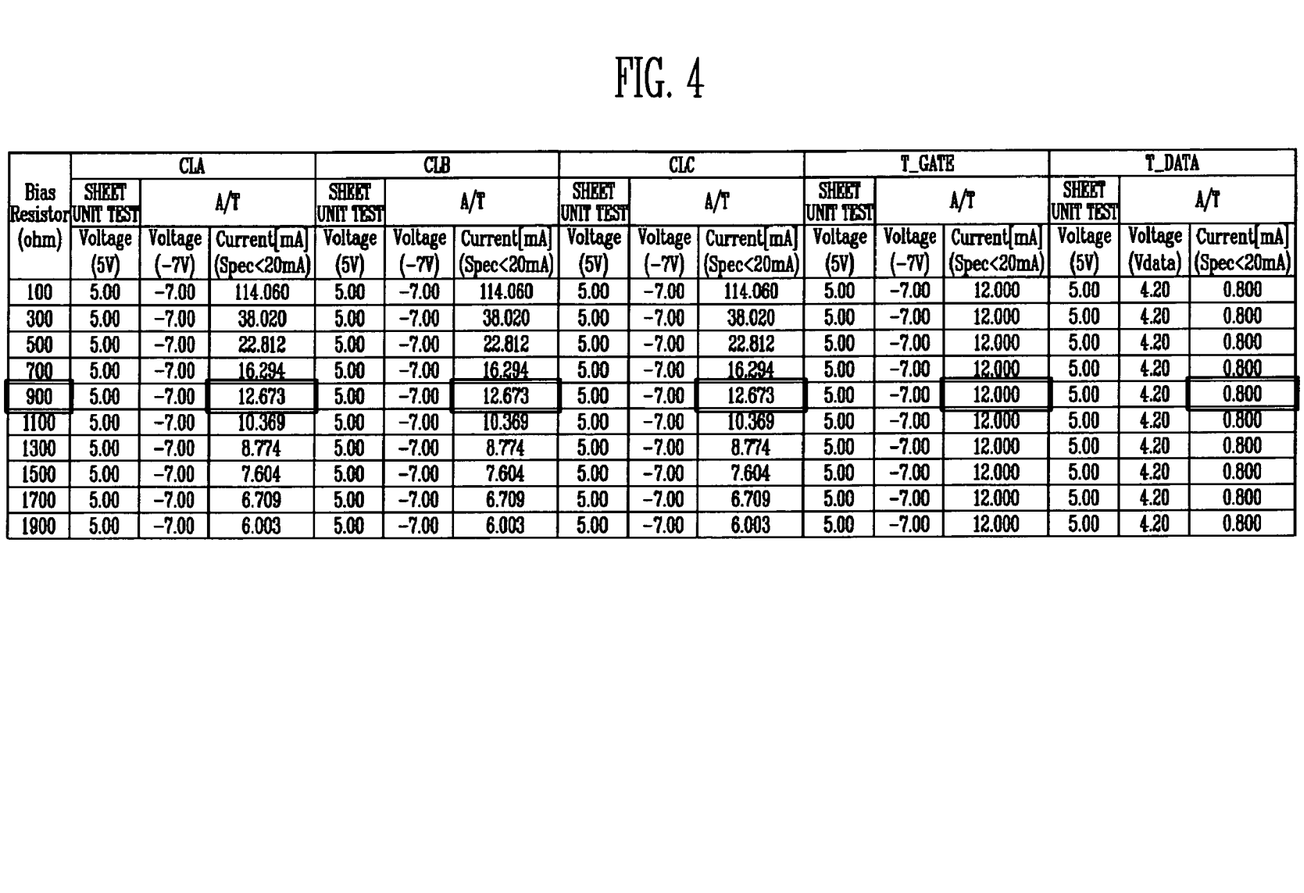
FIG. 4 illustrates a chart of simulation results of red, green, and blue clock signals according to resistance values of the resistors shown in FIGS. 2 and 3.

FIG. 4 illustrates a chart of simulation results of red, green, and blue clock signals according to resistance values for the resistors R shown in FIGS. 2 and 3.

For example, when a test equipment having a specification current Is of 20 mA is used, as shown in FIG. 4, and values of a red clock signal CLA, a green clock signal CLB, a blue clock signal CLC, a second test control signal T_GATE, and a second test data signal T_DATA are set and simulated, a resistance causing a current flowing during an array test A/T to be less than or equal to about 70% of the specification current Is may be equal to or greater than about 900 ohms. Accordingly, according to one or more aspects of the invention, under such circumstances, the resistance of the resistor R may be set to be equal to or greater than about 900 ohms.

Although this numerical value is to provide a detailed description of an exemplary embodiment of the present invention, the present invention is not limited thereto. That is, in the present invention, a resistance of the resistor R formed between the seventeenth wire 287 and first to fifth pads 295_1 to 295_5 can be set according to a construction of the test equipment or the organic light emitting display device 210, and may have various resistance values. Further, in the aforementioned exemplary embodiment, a resistance of the resistor R may be set to cause a flowing current during an array test A/T to be less than or equal to about 70% of the specification current Is. However, embodiments of the present invention are not limited thereto. That is, the resistance of the resistor R can be set as various values sufficient to stably maintain the second test section 240 and the data distributor 250 in an off state based on the bias signal Vbias supplied from the seventeenth wire 287. Thus, the resistor of the resistor R may be set as various values sufficient to prevent an electric current from flowing to an abnormal path when a test is performed using the second test section 240 and the data distributor 250.

In embodiments of the invention in which the seventeenth wire 287 may be included in the second wire group 280, the seventeenth wire 287 may be supplied the bias signal Vbias when the sheet unit test is being performed. However, embodiments of the present invention are not limited thereto. For example, the seventeenth wire 287 can be included in the first wire group 270.

In embodiments of the invention, the first and second test sections 260 and 240 may be set in an off state in order to avoid influencing an operation of the organic light emitting display devices 210 when the respective organic light emitting display device 210 has been scribed from the mother substrate 200. To do this, after scribing, the first and second test sections 260 and 240 may receive an externally supplied bias signal through the pad portion 295.

As is clear from the forgoing description, in embodiments of the present invention, voltages of power supplies and signals may be supplied through the first and second wire groups 270 and 280 during a sheet unit test, and the test data signal, e.g., the first test data signal, may be directly supplied to the pixel portion 230 from the first and/or second wire groups 270 and 280 through the first test section 260, without passing through the data distributor 250. This may cause a drive problem due to a signal delay that may occur during the test using the data distributor 250 to be solved.

In some embodiments of the invention, a second test section 240 may be formed and a separate test for the organic light emitting display device 210 may be performed using the second test section 240 and the data distributor 250, so that an array test of the data distributor 250 can be performed. In such embodiments of the invention, a test can be performed on the mother substrate 200 that involves all structural elements including the data distributor 250 that may be used when the organic light emitting display devices 210 are being driven. Here, the respective resistor R may be formed between the seventeenth wire 287 and the first to fifth pads 295_1 to 295_5 to prevent and/or reduce signals for the test from flowing to an abnormal path.

In the exemplary embodiment of the present invention described above, pixels included in the pixel portion 230 include red, green, and blue sub-pixels (not shown), and the first test section 260 may receive the first red test data signal, the first green test data signal, and the first blue test data signal from the thirteenth to fifteenth wires 283 to 285, and may supply the first red test data signal, the first green test data signal, and the first blue test data signal to the red, green, and blue sub-pixels. Embodiments of the present invention are not limited thereto. The number of the first test data signals can be variously set according to the number of sub-pixels constituting one pixel. Further, the same number of the wires supplying the first test data signal may be set as the number of the sub-pixels. In the same manner, the clock signals inputted to the data distributor 250 may be set to include a red clock signal, a green clock signal, and a blue clock signal. Embodiments of the present invention are not limited thereto. For example, various clock signals inputted to the data distributor 250 may be set according to the number and kind of the sub-pixels constituting one pixel.

Figure 5:
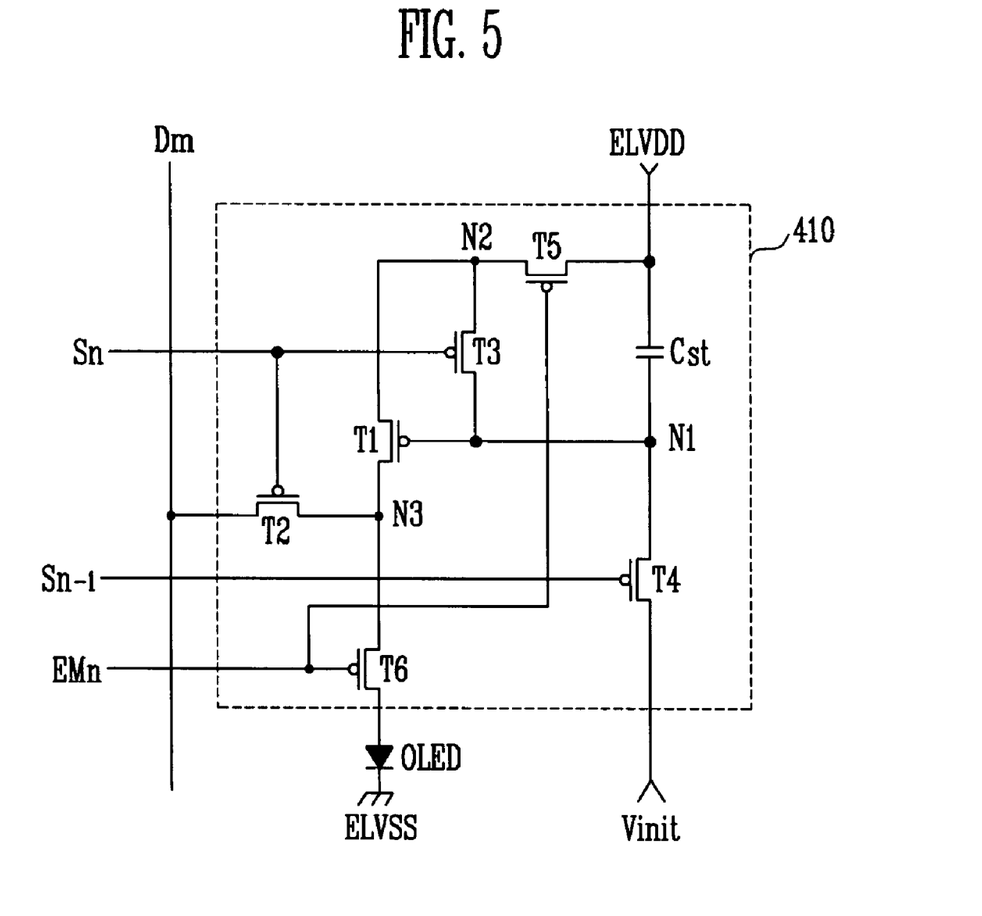
FIG. 5 illustrates a circuit diagram of an exemplary embodiment of a pixel employable by the pixel portion shown in FIGS. 1 to 3.

FIG. 5 illustrates a circuit diagram of an exemplary embodiment of a pixel employable by the pixel portion shown in FIGS. 1 to 3.

For convenience, in FIG. 5, a single exemplary pixel is illustrated and the red, green, and blue sub-pixels are not discerned from one another.

Referring to FIG. 5, the pixel may include an organic light emitting diode OLED and a pixel circuit 410. The pixel circuit 410 may be connected to an n-th scan line Sn, an n-th light emitting control line EMn, an m-th data line Dm, the first source voltage ELVDD, the initializing voltage Vinit, and the organic light emitting diode OLED, so that the organic light emitting diode OLED may emit light.

An anode electrode of the organic light emitting diode OLED may be connected to the pixel circuit 410, and a cathode electrode thereof may be connected to the second voltage source ELVSS.

The pixel circuit 410 may include first to sixth transistors T1 to T6 and a storage capacitor Cst. In FIG. 5, although the first to sixth transistors T1 to T6 are shown as P-type transistors, embodiments of the present invention are not limited thereto.

A first electrode of the first transistor T1 may be connected to a second node N2, and a second electrode thereof may be connected to a third node N3. A gate electrode of the first transistor T1 may be connected to a first node N1. The first transistor T1 may supply a current corresponding to a voltage stored in the storage capacitor Cst to the third node N3.

A first electrode of the second transistor T2 may be connected to an m-th data line Dm, and a second electrode thereof may be connected to the third node N3. A gate electrode of the second transistor T2 may be connected to a n-th scan line Sn. The second transistor T2 may be turned on when the scan signal is supplied to the n-th scan line Sn and may supply a data signal supplied to the m-th data line Dm to the third node N3.

A first electrode of the third transistor T3 may be connected to the second node N2, and a second electrode thereof may be connected to the first node N1. A gate electrode of the third transistor T3 may be connected to the n-th scan line Sn. The third transistor T3 may be turned on when the scan signal is supplied to the n-th scan line Sn, and the first transistor T1 may be diode-connected.

A first electrode of the fourth transistor T4 may be connected to the initializing voltage Vinit, and a second electrode thereof may be connected to the first node N1. A gate electrode of the fourth transistor T4 may be connected to an n−1-th scan line Sn-1. The fourth transistor T4 may be turned on when a scan signal is supplied to the n−1-th scan line Sn-1, and may initialize the storage capacitor Cst and the gate terminal of the first transistor T1. The voltage value of the initializing voltage Vinit may be set to be lower than the voltage value of the data signal.

A first electrode of the fifth transistor T5 may be connected to the first source voltage ELVDD, and a second electrode thereof may be connected to the second node N2. A gate electrode of the fifth transistor T5 may be connected to an n-th light emitting control line EMn. The fifth transistor T5 may be turned on when the light emitting control signal is not supplied to the n-th light emitting control line EMn, i.e., when a voltage level of the light emitting control signal is set a low level, and may transfer the first source voltage ELVDD to the second node N2.

A first electrode of the sixth transistor T6 may be connected to the third node N3, and a second electrode thereof may be connected to the anode electrode of the organic light emitting diode OLED. A gate electrode of the sixth transistor T6 may be connected to the n-th light emitting control line EMn. The sixth transistor T6 may be turned on when the light emitting control signal is not supplied to the n-th light emitting control line EMn, and may electrically connect the third node N3 to the organic light emitting diode OLED.

One terminal of the storage capacitor Cst may be connected to the first source voltage ELVDD and the first electrode of the fifth transistor T5, and another terminal thereof may be connected to the first node N1. The storage capacitor Cst may charge a voltage corresponding to a data signal and a threshold voltage Vth of the first transistor T1 when the scan signal is supplied to the n-th scan line Sn, and may maintain the charged voltage for one frame.

Figure 6:
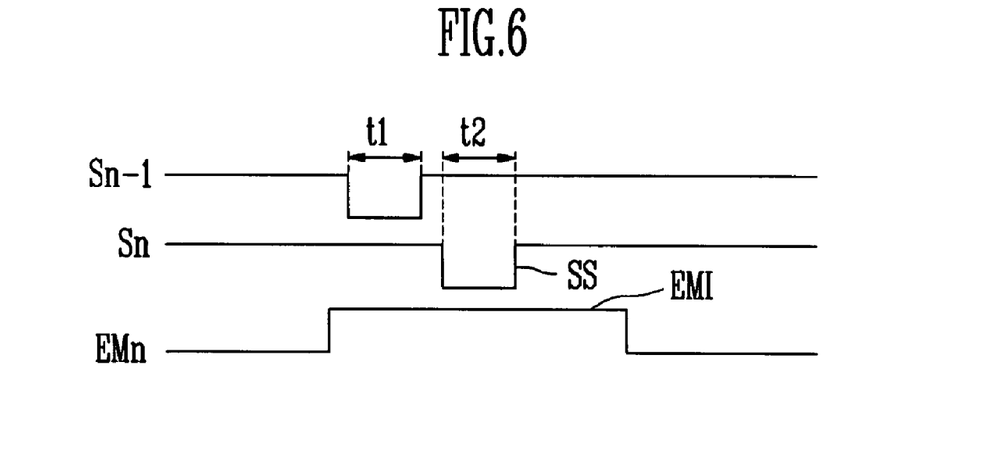
FIG. 6 illustrates a waveform diagram of signals that may be supplied to control the pixel circuit shown in FIG. 5.

FIG. 6 illustrates a waveform diagram of signals that may be supplied to control the pixel circuit shown in FIG. 5.

The exemplary operation of the pixel shown in FIG. 3 will be described in detail in connection with FIGS. 5 and 6.

Referring to FIG. 6, a scan signal Sn-1 may be supplied to the n−1-th scan line Sn-1 for a time period of t1, and a light emitting control signal EM1 may be supplied to the n-th light emitting control line EMn. If a light emitting control signal EMl is supplied to the n-th light emitting control line EMn, the fifth and sixth transistors T5 and T6 may be turned off. Further, the scan signal Sn-1 may be supplied to the n−1 scan line Sn-1, and may turn on the fourth transistor T4. If the fourth transistor T4 is turned on, the storage capacitor Cst and the gate terminal of the first transistor T1 may be connected to the initializing voltage Vinit. If the storage capacitor Cst and the gate terminal of the first transistor T1 are connected to the initializing source Vinit, the initializing voltage Vinit may be supplied to the storage capacitor Cst and the gate terminal of the first transistor T1 for initialization.

Thereafter, a scan signal SS may be supplied to the n-th scan line Sn for a time period of t2. If the scan signal SS is supplied to the n-th scan line Sn, the second and third transistors T2 and T3 may be turned on. If the third transistor T3 is turned on, the first transistor T1 may be diode-connected. When the second transistor T2 is turned on, the data signal supplied to the m-th data line Dm may be transferred to the third node N3. Then, since the gate terminal of the first transistor T1 may be initialized, by the initializing voltage Vinit, to a voltage value lower than the data signal, the voltage supplied to the third node N3 may pass through the first and third transistors T1 and T3, and may be supplied to the first node N1. Then, the threshold voltage Vth of the first transistor T1 and the voltage corresponding to the data signal may be stored in the storage capacitor Cst.

Thereafter, if the light emitting control signal EMI is not supplied to the n-th light emitting control line EMn, the fifth and sixth transistors T5 and T6 may be turned on. If the fifth and sixth transistors T5 and T6 are turned on, a current corresponding to the data signal may flow from the first source voltage ELVDD to the organic light emitting diode OLED and a light corresponding to the data signal may be generated in the organic light emitting diode OLED.

As is clear from the forgoing description, in the organic light emitting display device and the mother substrate according to one or more aspects of the present invention, the first and second wire groups may be included to perform a sheet unit test for a plurality of organic light emitting display devices on the mother substrate in a state where each of the organic light emitting display devices are not scribed. Thus, embodiments of the invention enable efficiency of the test to be improved.

Embodiments of the invention separately enable a sheet unit test to be performed by directly supplying test data signals to a pixel portion through a first test section, without having the test signal pass through a data distributor. Thus, embodiments of the invention enable a problem due to a drive signal delay occurring when a test using a data distributor is performed on the mother substrate.

Embodiments of the invention separately enable a second test section to be separately formed and a separate test for an organic light emitting display device to be performed using the second test section and a data distributor. Accordingly, embodiments of the invention enable tests to be performed with respect to all structural elements used when the organic light emitting displays are driven on the mother substrate. In some embodiments of the invention, resistors may be formed between a corresponding wire, e.g., the seventeenth wire, and pads, e.g., first to fifth pads, so that the test thereof can be normally and/or substantially normally performed.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display device, comprising:
a pixel portion including a plurality of pixels, which are coupled to scan lines and data lines;
a scan driver adapted to provide scan signals to the scan lines;
a first transistor group adapted to test the plurality of pixels, the first transistor group being directly connected to first ends of the data lines;
a second transistor group adapted to test the plurality of pixels, the second transistor group being connected to second ends of the data lines;
a data distributor coupled between the second ends of the data lines and the second transistor group;
a first wire group extending in a first direction at an outer area of the light emitting display device;
a second wire group extending in a second direction at the outer area of the light emitting display device; and
at least two resistors including one terminal electrically coupled to a predetermined wire included in the first or second wire group and another terminal that is in an electrically open state.

2. The organic light emitting display device as claimed in claim 1, wherein the data lines are directly connected to the pixel portion such that the data lines directly connect the first transistor group to the pixel portion.

3. The organic light emitting display device as claimed in claim 1, wherein the first transistor group includes a plurality of transistors, each of the plurality of transistors of the first transistor group being connected to one of the data lines, a gate electrode of the transistors being commonly connected to a pad of a pad portion of the light emitting display, and each of the transistors maintaining an off state according to an externally supplied bias signal.

4. The organic light emitting display device as claimed in claim 1, wherein the plurality of transistors of the first transistor group include a first color transistor group, a second color transistor group and a third color transistor group that are connected to a first, second and third pad of a pad portion of the light emitting display.

5. The organic light emitting display device as claimed in claim 1, wherein the second transistor group includes a plurality of transistors, which are coupled between a pad included in a pad portion and the data distributor.

6. The organic light emitting display device as claimed in claim 5, wherein gate electrodes of the transistors of the second transistor group are commonly coupled to a second pad included in the pad portion, and the transistors simultaneously turn-on based on a second test control signal supplied from the second pad and supply the second test data signal to the data distributor.

7. The organic light emitting display device as claimed in claim 5, wherein the plurality of transistors of the second transistor group include a first color transistor group, a second color transistor group and a third color transistor group that are connected to a third, fourth and fifth pad of a pad portion of the light emitting display.

8. The organic light emitting display device as claimed in claim 5, wherein the pad portion is further away from the pixel portion than the data distributor.

9. The organic light emitting display device as claimed in claim 1, wherein the first transistor group is arranged on a first side of the pixel portion, and the second transistor group and the data distributor are arranged on a second side of the pixel portion, the first side being opposite to the second side.

10. The organic light emitting display device as claimed in claim 1, wherein the plurality of transistors in the second transistor group maintain an off state based on an externally supplied bias signal.

11. The organic light emitting display device as claimed in claim 1, wherein an end of the first wire group and an end of the second wire group are in an electrically open state.

12. The organic light emitting display device as claimed in claim 1, wherein at least one of the first wire group and the second wire group are electrically disconnected from the pixel portion.

13. The organic light emitting display device as claimed in claim 1, wherein the first wire group and the second wire group are electrically disconnected from the pixel portion.

14. The organic light emitting display device as claimed in claim 1, wherein the resistors are disposed outside of a scribe line of the organic light emitting display device in which the second test section and the data distributor connected to the resistor are arranged.

15. A mother substrate including a plurality of organic light emitting display devices, comprising:
   a first wire group extending in a first direction at outer areas of the organic light emitting display devices; and
   a second wire group extending in a second direction at the outer areas of the organic light emitting display devices, wherein each of the organic light emitting display devices includes:
   a pixel portion including a plurality of pixels, which are coupled to scan lines and data lines;
   a scan driver adapted to provide scan signals to the scan lines;
   a first test section coupled to first ends of the data lines;
   a second test section coupled to second ends of the data lines;
   a data distributor coupled between the second ends of the data lines and the second test section; and
   at least two resistors between a predetermined wire included in the first or second wire group and the second test section, and between the predetermined wire and the data distributor.

16. The mother substrate as claimed in claim 15, wherein each of the organic light emitting display devices further includes a pad portion including a plurality of pads for receiving externally supplied power supply voltages and signals.

17. The mother substrate as claimed in claim 16, wherein the resistors are disposed between the pad portion and the predetermined wire included in the first or second wire group.

18. The mother substrate as claimed in claim 17, wherein the second test section includes a plurality of transistors having a first terminal thereof coupled to the data distributor, a second terminal thereof coupled to a first pad of the plurality of pads, and a gate terminal commonly coupled to a second pad of the plurality of pads, wherein one of the resistors is arranged between the first pad and a predetermined wire including in the first or second wire group, and another of the resistors is arranged between the second pad and the predetermined wire group.

19. The mother substrate as claimed in claim 15, wherein the resistors are disposed outside of a scribe line of the organic light emitting display device in which the second test section and the data distributor connected to the resistor are arranged.

20. The mother substrate as claimed in claim 15, wherein the data distributor includes:
   first distribution transistors coupled between one of transistors included in the second test section and data lines of a first sub-pixel of the pixel portion;
   second distribution transistors coupled between one of the transistors included in the second test section and data lines of a second sub-pixel of the pixel portion; and
   third distribution transistors coupled between one of the transistors included in the second test section and data lines of a third sub-pixel of the pixel portion.

21. The mother substrate as claimed in claim 20, wherein:
   one of the resistors is disposed between a third pad to which gate electrodes of the first distribution transistors are coupled in common and a predetermined wire included in the first or second wire group;
   a second one of the resistors is disposed between a fourth pad to which gate electrodes of the second distribution transistors are coupled in common and the predetermined wire; and
   a third one of the resistors is disposed between a fifth pad to which gate electrodes of the third distribution transistors are coupled in common and the predetermined wire, respectively.

22. The mother substrate as claimed in claim 15, wherein each of the first and second test sections includes a plurality of transistors coupled to the data lines, the transistors included in the first test section being turned on during a first period of time and the transistors included in the second test section being turned on during a second period of time, the first period of time being different from the second period of time.

23. The mother substrate as claimed in claim 22, wherein:
   the transistors included in the first test section are simultaneously turned-on according to a first test control signal supplied from the first or second wire group and supply a first test data signal from the first or second wire group to the data lines, and
   the transistors included in the second test section maintain an off state according to a bias signal supplied from the first or second wire group through the resistor.

24. The mother substrate as claimed in claim 23, wherein:
   the data distributor includes a plurality of transistors between the transistors included in the second test section and the data lines, and
   the transistors included in the data distributors maintain an off state according to a bias signal supplied from the first or second wire group through the resistor.

25. The mother substrate as claimed in claim 22, wherein:
   the transistors included in the first test section maintain an off state according to a predetermined control signal supplied from the first or second wire group, and
   the transistors included in the second test section are simultaneously turned-on according to a second test control signal supplied from an exterior through a pad portion.

26. The mother substrate as claimed in claim 25, wherein the data distributor supplies a second test data signal from the second test section to at least one of first sub pixels, second sub pixels, and third sub pixels.

27. The mother substrate as claimed in claim 15, wherein:
   the first wire group is connected to respective ones of the organic light emitting display devices, which are commonly disposed in a same column, and
   the second wire group is connected to respective ones of the organic light emitting display devices, which are commonly disposed in a same row.

28. The mother substrate as claimed in claim 15, wherein the first test section includes a plurality of transistors, which are coupled between one of the wires included in the first or second wire group and one of the data lines.

29. The mother substrate as claimed in claim 28, wherein the transistors included in the first test section are simultaneously turned-on according to a first test control signal supplied from a predetermined wire of the first or second wire group, and supply a first test data signal to the data line.

* * * * *